US007248500B2

(12) United States Patent
Tamada et al.

(10) Patent No.: US 7,248,500 B2
(45) Date of Patent: Jul. 24, 2007

(54) NONVOLATILE SEMICONDUCTOR MEMORY DEVICE HAVING REDUCED DEPENDENCY OF A SOURCE RESISTANCE ON A POSITION IN AN ARRAY

(75) Inventors: Satoru Tamada, Tokyo (JP); Yuichi Kunori, Tokyo (JP); Fumihiko Nitta, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/329,036

(22) Filed: Jan. 11, 2006

(65) Prior Publication Data
US 2006/0158932 A1   Jul. 20, 2006

(30) Foreign Application Priority Data
Jan. 20, 2005   (JP) .............................. 2005-012636

(51) Int. Cl.
*G11C 16/28* (2006.01)
(52) U.S. Cl. .............................. 365/185.2; 365/185.05; 365/185.18; 365/185.23; 365/210
(58) Field of Classification Search .............. 365/185.2
See application file for complete search history.

(56) References Cited
U.S. PATENT DOCUMENTS
4,972,378 A * 11/1990 Kitagawa et al. ...... 365/185.11

5,016,216 A *  5/1991 Ali ........................ 365/185.05
5,689,468 A * 11/1997 Ihara ........................ 365/203
6,829,171 B2 * 12/2004 Ooishi .................... 365/185.21
6,885,579 B2 *  4/2005 Sakimura et al. ........... 365/158

FOREIGN PATENT DOCUMENTS
JP      2000-285692 A    10/2000

* cited by examiner

*Primary Examiner*—Tan T. Nguyen
(74) *Attorney, Agent, or Firm*—McDermott Will & Emery LLP

(57) ABSTRACT

A dummy cell having a low threshold voltage is disposed in a memory cell array in alignment with a memory cell. A dummy cell with a low threshold voltage adjacent to a selected memory cell column is selected, and a source-side local bit line of the selected memory cell is coupled to a global bit line via such dummy cell. Since the source-side local bit line is coupled to a ground node at its both ends, source resistance of the memory cell can be reduced, and dependency of the source resistance of the memory cell on the position within the memory cell array can also be reduced. This allows for reducing dependency of source resistance of a memory cell on the position within the memory cell array and on the temperature in a nonvolatile semiconductor memory device.

10 Claims, 16 Drawing Sheets

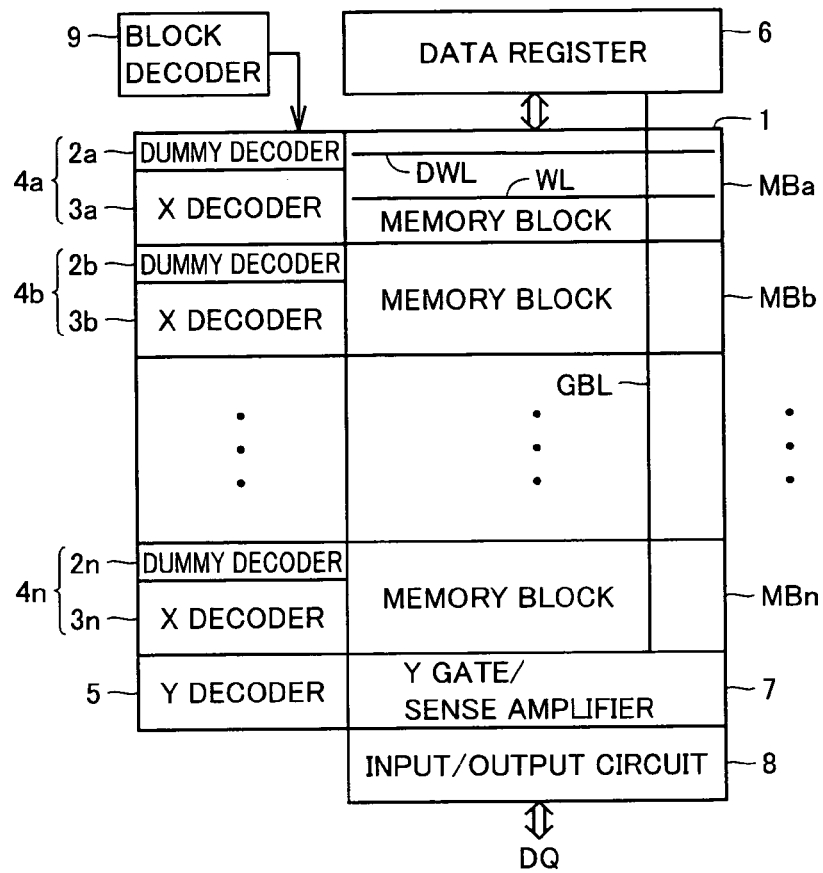
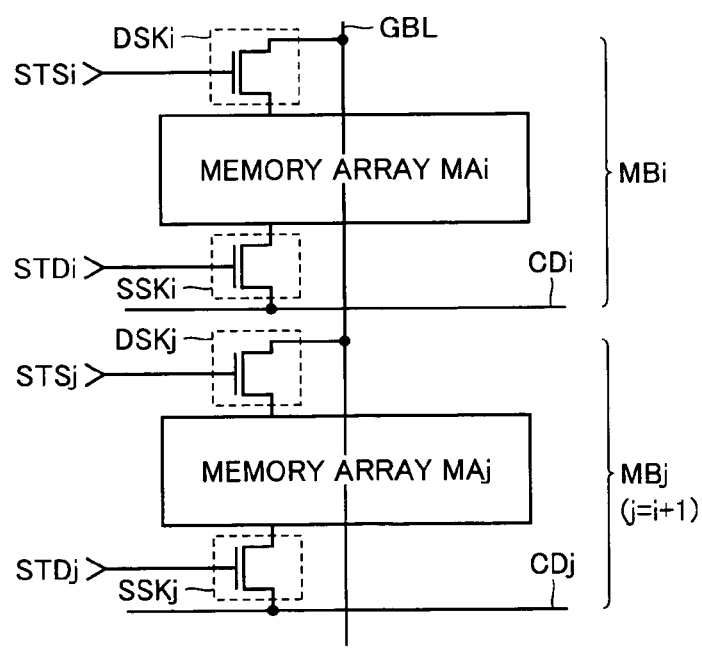

FIG.11

| WORD LINE READ VOLTAGE 1 | GBL POTENTIAL 1 AFTER DISCHARGE | WORD LINE READ VOLTAGE 2 | GBL POTENTIAL 2 AFTER DISCHARGE | WORD LINE READ VOLTAGE 3 | GBL POTENTIAL 3 AFTER DISCHARGE | CELL Vth | READ DATA |
|---|---|---|---|---|---|---|---|
| 3V | 0V | 4V | 0V | 2V | 0V | LESS THAN 2V | "11" |
| | | | | | 1V | 2V~3V | "10" |
| | | | 1V | | 0V | | |
| | | | | | 1V | | |
| | 1V | | 0V | | 0V | | |
| | | | | | 1V | 3V~4V | "00" |
| | | | 1V | | 0V | | |
| | | | | | 1V | NOT LESS THAN 4V | "01" |

FIG.12

|  | Cell MCa | Cell MCb | Cell MCc | Cell MCd |
|---|---|---|---|---|
| GBL0 | 1V→ DISCHARGE | 1V→ DISCHARGE | 0V | 0V |
| GBL1 | 0V | 0V | 1V→ DISCHARGE | 1V→ DISCHARGE |
| STS | 5V | 5V | 5V | 5V |
| DWL0 | 3V | 3V | -2V | -2V |
| DWL1 | -2V | -2V | 3V | 3V |
| AG0 | 5V | 5V | 5V | 5V |
| AG2 | 5V | 5V | 5V | 5V |
| AG1 | -2V | 5V | 5V | -2V |
| AG3 | 5V | -2V | -2V | 5V |
| STD | 5V | 5V | 5V | 5V |
| CD | 0V | 0V | 0V | 0V |

NONVOLATILE SEMICONDUCTOR MEMORY DEVICE HAVING REDUCED DEPENDENCY OF A SOURCE RESISTANCE ON A POSITION IN AN ARRAY

BACKGROUND OF THE INVENTION

1. Field of the Invention

The present invention relates to a nonvolatile semiconductor memory device, and in particular to a nonvolatile semiconductor memory device in which a memory cell is formed of a stacked gate field effect transistor having a floating gate for accumulating electric charge to store data. More specifically, the present invention relates to a configuration for improving read margin in an AG (assist gate)-AND type flash memory utilizing an inversion layer formed on the surface of a substrate region as a bit line.

2. Description of the Background Art

In a nonvolatile semiconductor memory device, a memory cell transistor has a threshold voltage changed according to stored data. To read the data, a voltage of a certain level is applied to a control gate of the memory cell transistor and the amount of a current flowing through the memory cell transistor is sensed with a sense amplifier. During the data read, the drain side of the memory cell transistor is supplied with predetermined current and voltage, and the source side is grounded via a source line. The grounding is effected by connecting the source line to a common source line (common line) provided on one side of a memory array. Interconnection resistance is present in the source line, and source line resistance exists between a ground node and the memory cell transistor, of which value depends on the distance therebetween.

When a current flows through the source line, a voltage drop occurs according to the source line resistance, increasing a source potential of the memory cell transistor. If a constant voltage is applied to the control gate when the source potential is increased, a voltage Vgs between the control gate and the source is reduced, and an absolute value of the threshold voltage is increased due to a substrate effect (back gate effect). Accordingly, even in the case where the memory cell transistor is to be conductive when selected, it may not become so fully conductive as to drive a read current of a sufficient magnitude, which may cause a read error.

In particular, when the source line is formed of a diffusion layer or an inversion layer, its resistance value is increased, as compared to the case where it is formed of a metal interconnection line, and it also has great temperature dependency, so that the influence of variation of source line resistance of a memory cell transistor according to the position of the memory cell in an array is increased. In particular, when the source line is formed of an inversion layer, it resistance value is further increased compared to the case where it is formed of a diffusion layer, and thus the influence of variation becomes further greater.

Prior art Document 1 (Japanese Patent Laying-Open No. 2000-285692) discloses a configuration for reducing such dependency of the source line resistance on the position in an array. In the configuration described in Prior art Document 1, a voltage level applied to a word line (control gate) is changed according to a distance from a source line grounding node. A word line voltage is increased to compensate for an increase in source potential, and thus each memory cell has the same control gate to source voltage Vgs.

In Prior art Document 1, the voltage level for selecting a word line is changed according to the magnitude of the source line resistance, that is, the position of a memory cell. Accordingly, the voltage applied to a word line should be changed according to a selected row, complicating the control when selecting a word line.

SUMMARY OF THE INVENTION

An object of the present invention is to provide a nonvolatile semiconductor memory device having a reduced dependency of source line resistance of a memory cell transistor on a position in an array and on temperature, with a simple circuit configuration.

A nonvolatile semiconductor memory device in accordance with the present invention includes: a memory array having a plurality of memory cells arranged in rows and columns and each storing data in a nonvolatile manner; a row of a plurality of dummy cells arranged at one end side of the memory array in a row direction in alignment with the memory cells and each storing fixed data; a plurality of bit lines disposed corresponding to the respective columns of the memory cells and provided on both sides of the columns of the memory cells; a plurality of word lines disposed corresponding to the rows of the memory cells; a dummy word line disposed corresponding to the row of the dummy cells; and row selection circuitry for selecting a word line from the plurality of word lines for an addressed row in response to an address signal and selecting the dummy word line upon data reading. The memory cell in the selected row and the selected dummy cell on the same column share a first bit line.

The nonvolatile semiconductor memory device in accordance with the present invention further includes column selection/voltage supply circuitry for supplying a read voltage to a second bit line connecting to a memory cell on an addressed column in response to an address signal, and supplying a voltage at the same voltage level as that of a voltage supplied to the first bit line upon reading to a third bit line connecting to the dummy cell, from a side opposite to a side supplying the voltage to the first bit line, during the data read.

The dummy cell is connected between the first and the third bit lines, and a reference voltage is supplied to the first bit line via the dummy cell. Accordingly, the first bit line is supplied with the reference voltage from its both ends, which in turn are connected to reference voltage nodes, reducing resistance distribution on the first bit line depending on the position of a memory cell connected to the first bit line. Thus, dependency of source line resistance on the position of a memory cell within a memory cell array can be reduced, and temperature dependency can be reduced accordingly, improving read margin.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 schematically shows an entire configuration of a nonvolatile semiconductor memory device in accordance with a first embodiment of the present invention.

FIG. 2 shows a configuration of a memory block shown in FIG. 1 more specifically.

FIG. 11 shows, in a list form, an applied voltages when multi-value data is read in a modification of the first embodiment of the present invention.

FIG. 12 shows, in a list form, an applied voltage of each signal when a memory cell of the memory cell array shown in FIG. 3 is selected.

DESCRIPTION OF THE PREFERRED EMBODIMENTS

First Embodiment

Figure 3:
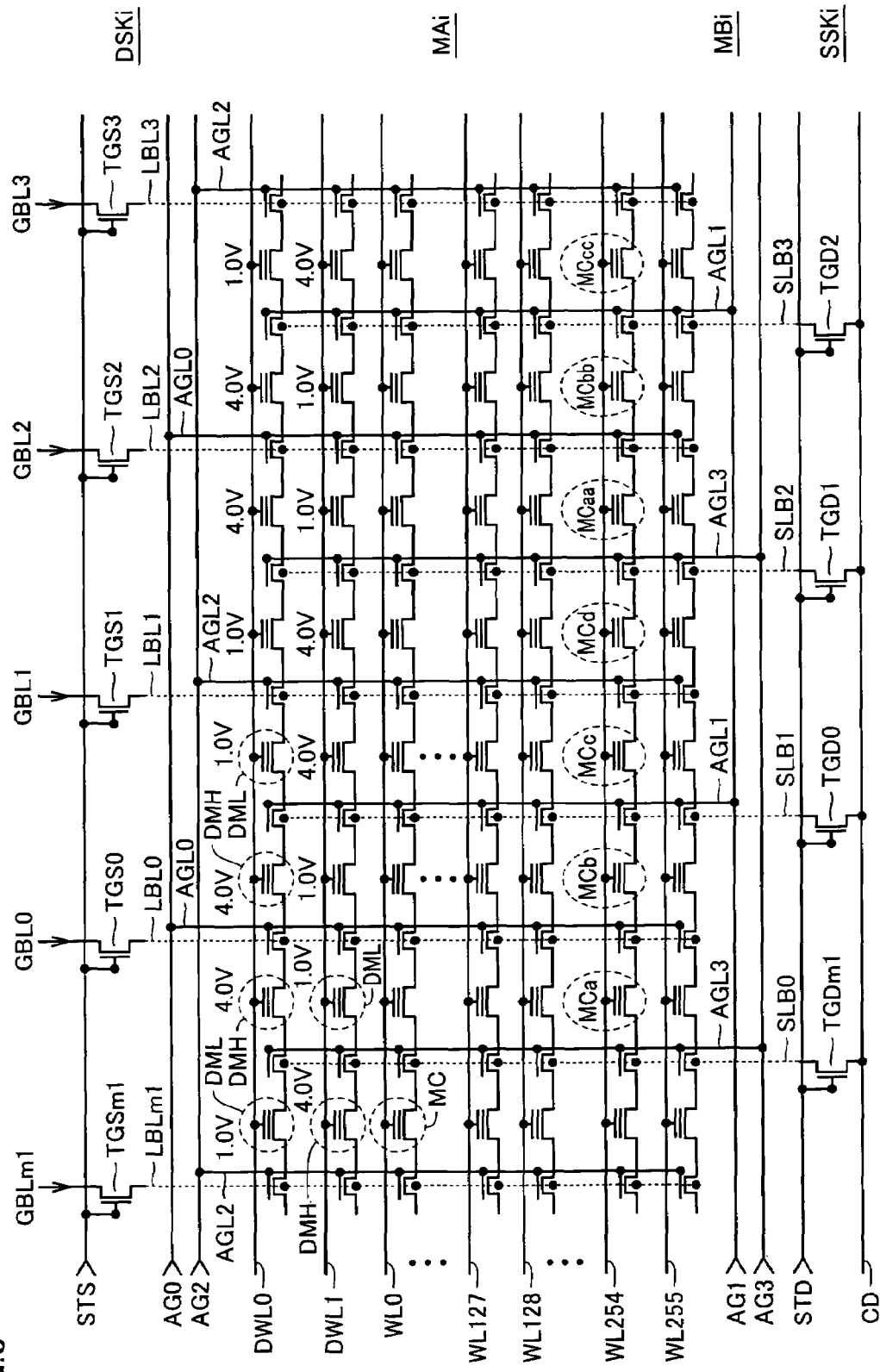
FIG. 3 shows a configuration of a memory array shown in FIG. 2 in detail.

FIG. 1 schematically shows an entire configuration of a nonvolatile semiconductor memory device according to a first embodiment of the present invention. In FIG. 1, the nonvolatile semiconductor memory device includes a memory mat 1 divided into a plurality of memory blocks MBa-MBn. Each of memory blocks MBa-MBn includes a word line WL connecting to a memory cell storing data, and a dummy word line DWL connecting to a dummy cell having the same configuration as that of the memory cell and storing fixed data. As will be described later in detail, the dummy cell connected to dummy word line DWL is utilized to reduce a source line resistance of a selected memory cell.

The nonvolatile semiconductor memory device further includes dummy decoders 2a-2n disposed corresponding to memory blocks MBa-MBn, respectively, each for selecting a dummy word line in a corresponding memory block upon data read, and X decoders 3a-3n disposed corresponding to memory blocks MBa-MBn, respectively, each for selecting a word line from a corresponding one of memory blocks MBa-MBn in response to an address signal.

A dummy decoder and an X decoder form a row decoder for selecting a row. FIG. 1 shows that memory blocks MBa-MBn are provided with row decoders 4a-4n, respectively. The dummy decoder is supplied with a Y address signal indicating an even/odd numbered column, and the X decoder is supplied with an X address signal designating a word line.

In memory mat 1, a global bit line GBL is provided commonly to memory blocks MBa-MBn. The global bit line is disposed corresponding to a bit line of each of memory blocks MBa-MBn, and a bit line in a selected memory block, or a local bit line, is coupled to a corresponding global bit line.

The nonvolatile semiconductor memory device further includes: a Y decoder 5 for decoding a Y address signal (not shown) to generate a column selection signal; a data register 6 for storing write data upon data writing; a Y gate/sense amplifier block 7 for selecting a global bit line corresponding to a selected column in response to the column selection signal from Y decoder 5 and sensing data on the global bit line in data read or verification; and an input/output circuit 8 for performing data input/output between the selected global bit line and the outside of the memory through a Y gate of Y gate/sense amplifier block 7.

Global bit line GBL is connected to data register 6, and a potential corresponding to write data is transferred to global bit line GBL in data writing.

A memory block is selected based on a block selection signal from a block decoder 9 receiving a block address signal.

FIG. 2 shows connection between a memory block and a global bit line specifically. FIG. 2 represents a configuration of a portion including memory blocks MBi and MBj (j=i+1).

Global bit line GBL is provided commonly to memory blocks MBi and MBj. Memory block MBi includes: a memory array MAi in which memory cells and dummy cells are provided; a drain-side block selection circuit DSKi for connecting a drain-side local bit line of memory array MAi to global bit line GBL in response to a block selection control signal STSi; and a source-side block selection circuit SSKi for connecting a source-side local bit line of memory array MAi to a common line CDi in response to a block selection control signal STDi.

Memory block MBj includes: a memory array MAj in which a memory cell and a dummy cell are provided; a drain-side block selection circuit DSKj connecting a drain-side local bit line of memory array MAj to global bit line GBL in response to a block selection control signal STSj; and a source-side block selection circuit SSKj connecting a source-side local bit line of memory array MAj to a common line CDj in response to a block selection control signal STDj.

Common lines CDi and CDj may have voltage levels settable individually, or may be commonly coupled to a global ground line.

The memory cells in adjacent columns share a local bit line, and one local bit line is used as a drain or a source of a memory cell depending on a selected column of the memory cell. Whether the local bit line is used as a drain line or a source line in a selected column is determined by the Y address signal designating a column to be selected.

Block selection control signals STSi, STSj, STDi, and STDj are supplied from block decoder 9 shown in FIG. 1. Accordingly, a memory array in a selected memory block is connected to global bit line GBL and to a common line, to perform data writing or reading.

FIG. 3 shows a further detailed configuration of memory block MBi shown in FIG. 2. FIG. 3 represents a configuration of a portion for performing reading or writing of 2-bit data. In FIG. 3, memory array MAi includes memory cells MCs arranged in rows and columns and each storing data in a nonvolatile manner, and dummy cells DMLs and DMHs formed in alignment with memory cells MCs.

Memory cell MC and dummy cells DML and DMH have the same configuration (electrical characteristics, and geometrical feature), each formed of a stacked gate field effect transistor storing information by accumulating electrical charge in a floating gate (to set a threshold voltage). Word lines WL0-WL255 are provided corresponding to the respective rows of memory cells MCs, and are connected to control gates of memory cells in the corresponding rows.

Dummy cells DML and DMH are alternately disposed in units of two bits in a row direction (in a direction in which a word line extends). Further, in a column direction, dummy cells DML and DMH are aligned and disposed in two rows. Dummy cell DMH has its threshold voltage Vth set for example at 4.0 V, and dummy cell DML has its threshold voltage Vth set for example at 1.0 V. When data is read, a voltage of an intermediate value, for example 3.0 V, is applied to the control gates of dummy cells DML and DMH, causing dummy cells DMH and DML to be nonconductive and conductive, respectively.

Dummy word lines DWL0 and DWL1 are disposed corresponding to the respective rows of dummy cells DMLs and DMHs. In each column, when dummy cell DML having a low threshold voltage is connected to one of dummy word lines DWL0 and DWL1, dummy cell DMH having a high threshold voltage is connected to the other dummy word line.

Assist gate lines AGL0-AGL3 are sequentially and cyclically provided corresponding to the respective columns of the memory cells. Assist gate lines AGL0-AGL3 are supplied with assist gate control signals AG0-AG3, respectively. Assist gate lines AGL0 and AGL 2 receive assist gate control signals AG0 and AG2, respectively, at an end portion opposite to lines transferring assist gate control signals AG1 and AG3. Assist gate lines AGL0-AGL3 receive respective assist gate control signals AG0-AG3 at alternately opposite end portions. Each of these assist gate lines AGL0-AGL3, the configuration of which will be described later in detail, corresponds to the gate of a MOS transistor (an insulating gate type field effect transistor) and forms an inversion layer in a semiconductor substrate region therebelow in response to the assist gate control signal. The inversion layer forms a local bit line. In FIG. 3, assist gate lines AGL0 and AGL2 form drain-side local bit lines LBLm1-LBL3, and assist gate lines AGL1 and AGL3 form source-side local bit lines SLB0-SLB3.

Drain-side local bit lines LBLm1, LBL0-LBL3 are coupled to global bit lines GBLm, GBL0-GBL3 via drain-side block selection gates TGSm1, TGSD0-TGS3, respectively. These drain-side block selection gates TGSm1-TGS3 are commonly supplied with block selection control signal STS (STSi). Drain-side block selection gates TGSm1-TGS3 correspond to components of drain-side block selection circuit DSKi shown in FIG. 2. Global bit line GBLm1 and LBLm1 indicate the global bit line and the local bit line in an adjacent bit line group.

Source-side local bit lines SLB0-SLB3 are coupled to common line CD via correspondingly provided source-side block selection gates TGDm1, TGD0-TGD2 respectively. These source-side block selection gates TGDm1-TGD2 are commonly supplied with block selection control signal STD (STDi). Source-side block selection gates TGDm1-TGD2 correspond to components of source-side block selection circuit SSKi shown in FIG. 2.

Local bit line SLB is also formed of an inversion layer formed below assist gate lines AGL1 and AGL3.

Figure 4:
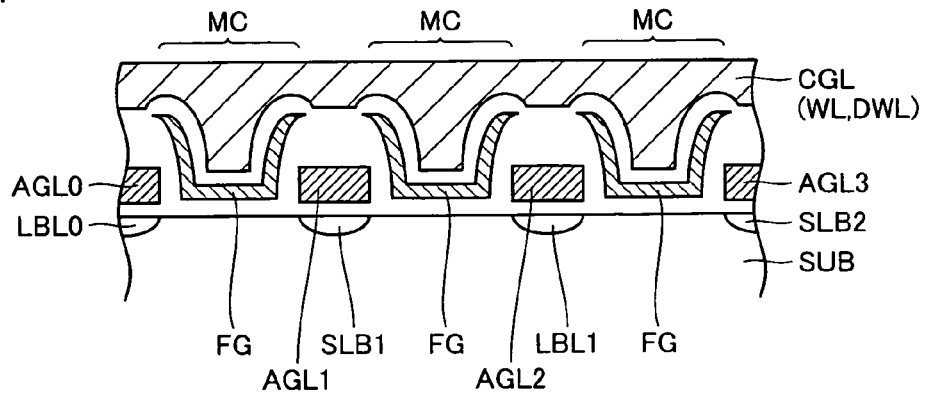
FIG. 4 schematically illustrates a cross sectional structure of a memory cell array shown in FIG. 3.

FIG. 4 schematically illustrates a cross sectional structure of memory cells MCs in the memory array shown in FIG. 3. In FIG. 4, assist gate lines AGL0-AGL3 are formed at intervals on a surface of a semiconductor substrate region SUB. In each interval between these assist gate lines AGL0-AGL3, a floating gate FG is provided for each memory cell MC.

Local bit lines LBL0 and LBL1 are formed below assist gate lines AGL0 and AGL2, respectively, and source-side local bit lines SLB1 and SLB2 are formed below assist gate lines AGL1 and AGL3, respectively. When substrate region SUB is of p-type, a positive voltage is applied to assist gate lines AGL0-AGL3 to form an inversion layer in the surface of the substrate region below each assist gate line, forming a path through which electrical charge flows. When assist gate lines AGL0-AGL3 are not selected and set at a voltage level not higher than a ground voltage level, an inversion layer is not formed in a local bit line region below each assist gate line, and the path through which electrical charge flows is cut off.

In a layer above floating gates FGs, a control gate line (word line) CGL is formed in a direction crossing the assist gate line. Control gate line CGL corresponds to a word line. Dummy cell DMC also has the same structure as that of memory cell MC shown in FIG. 4, and has control gate line CGL used as dummy word line DWL.

Figure 5:
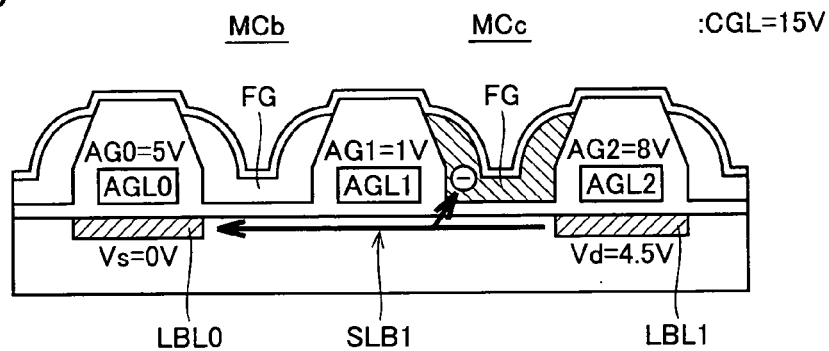
FIG. 5 schematically illustrates applied voltages and a current flow when data is written to the memory cell array shown in FIG. 4.

FIG. 5 shows an example of voltages applied when data is written to a memory cell. Writing to a memory cell refers to a state where an electron is injected into floating gate FG.

In FIG. 5, the voltages applied when data is written to memory cell MCc are shown as an example. In this case, a voltage of 8 V is applied to assist gate line AGL2, a voltage of 1 V is applied to assist gate line AGL1, and a voltage of 5 V is applied to assist gate line AGL0. Although not shown in FIG. 5, a ground voltage of 0 V or a negative voltage of −2.0 V is supplied to assist gate line AGL3.

A drain voltage Vd of 4.5 V is supplied to local bit line LBL1 below assist gate line AGL2 via a global bit line. On the other hand, a source voltage Vs of 0 V is applied from the common line to local bit line LBL0 below assist gate line AGL0 via a global bit line.

In this state, since the voltage of 1 V is supplied to assist gate line AGL1, a weak inversion layer is merely formed in underlying source-side local bit line SLB1, which in turn has a high channel resistance value. On the other hand, since the voltage of 8 V is applied to assist gate line AGL2, a strong inversion layer is formed, and thus drain voltage Vd of 4.5 V is sufficiently supplied. Similarly, since the voltage of 5 V is applied to assist gate line AGL0, an inversion layer is formed in local bit line LBL0 below it and set at the ground voltage of 0V.

Under the above write condition, a current flows from local bit line LBL1 to local bit line LBL0. Since the weak inversion layer having high channel resistance is formed below assist gate line AGL1, a high electric field is generated. Accordingly, a hot carriers (hot electrons) are produced to be injected into the floating gate of memory cell MCc by the high electric field formed below assist gate line AGL1. When a high voltage (for example, 15 V) is supplied to the control gate line (not shown), the hot electrons are attracted by the high voltage to the floating gate FG to be injected thereinto.

Remaining drain current flows to local bit line LBL0 below assist gate line AGL1, and is discharged to the common line. When data is written, source-side local bit line SLB1 is used to generate a high electric field making advantage of its high channel resistance, and the discharge to common line CD shown in FIG. 3 substantially not occurs.

Figure 6:
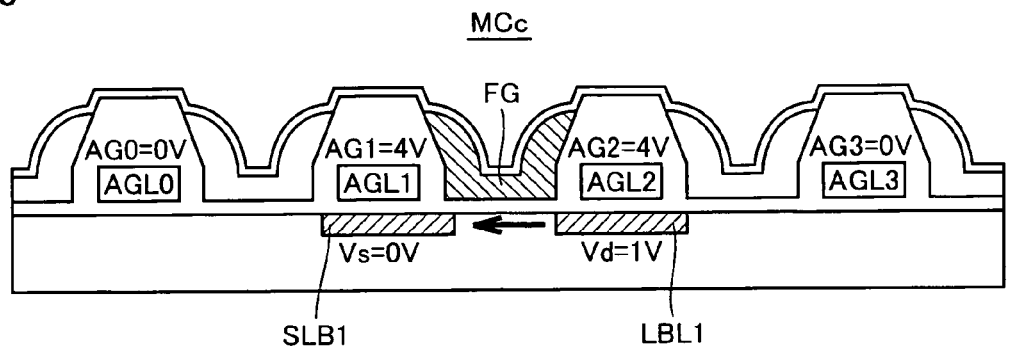
FIG. 6 schematically illustrates applied voltages and a current flow when data is read in the memory cell array configuration shown in FIG. 4.

FIG. 6 shows an example of voltages applied when data is read from a memory cell. Also in FIG. 6, the voltages applied when data stored in memory cell MCc is read are shown as an example. In this case, the ground voltage (0 V) is applied to assist gate lines AGL0 and AGL3. Consequently, no inversion layer is formed below assist gate lines AGL0 and AGL3. On the other hand, a voltage of 4 V is applied to assist gate lines AGL2 and AGL1. In this case, an inversion layer is formed below assist gate line AGL2, local bit line LBL1 is in a low-resistance state, and drain voltage Vd of 1 V is applied as a read voltage via a corresponding global bit line. Source-side sub bit line SLB1 is connected to common line CD via selection gate TGD0 shown in FIG. 3, and supplied with the ground voltage (0 V) as source voltage Vs.

A read voltage of 2 to 5 V is applied to the control gate line (word line) not shown. When floating gate FG is in the write state and an electrons are accumulated, no inversion layer is formed below floating gate FG, and no memory cell current flows. On the other hand, when electrons are drawn from floating gate FG (referred to as erase state), memory cell MCc has a low threshold voltage, and a current flows from local bit line LBL1 to source-side local bit line SLB1. The current flowing in memory cell MCc is sensed by a sense amplifier via a global bit line, to read data stored in memory cell MCc.

The sense amplifier may be a voltage-sensing type sense amplifier that determines whether a global bit line is lower in voltage level than a precharge voltage (1 V), or a current-sensing type sense amplifier that detects whether a current not less than a reference current flows.

As shown in FIG. 6, when data is read, a current flows to source-side local bit line SLB1 according to data stored in memory cell MCc (when memory cell MCc is in erase state). Consequently, in a conventional configuration where a dummy cell is not provided, when source-side local bit line SLB1 is formed of an inversion layer, it has a higher resistance value than when it is formed of a diffusion layer, and the degree of increase in a source potential more greatly varies depending on the position of a memory cell (due to the difference in distance through which the memory cell current flows in the source-side local bit line).

In the present invention, the resistance value in the source-side local bit line is equivalently reduced using dummy cell DML, to reduce the dependency on the position of a memory cell within a memory array as well as the temperature dependency.

For adjusting the threshold voltages of dummy cells DML and DMH, the write scheme is used to provide a dummy cell having a high threshold voltage. Generally, a dummy cell having a low threshold voltage is usually in a state where no carrier (electron) is accumulated in a floating gate after completion of a manufacturing process. Thus, the initial state of a dummy cell is a low threshold voltage state, and a process for decreasing the threshold voltage of the dummy cell need not be performed in particular. However, an erasure process of moving a carrier between a floating gate and a semiconductor substrate region or a control gate to draw out the carriers from the floating gate may be performed.

Figure 7:
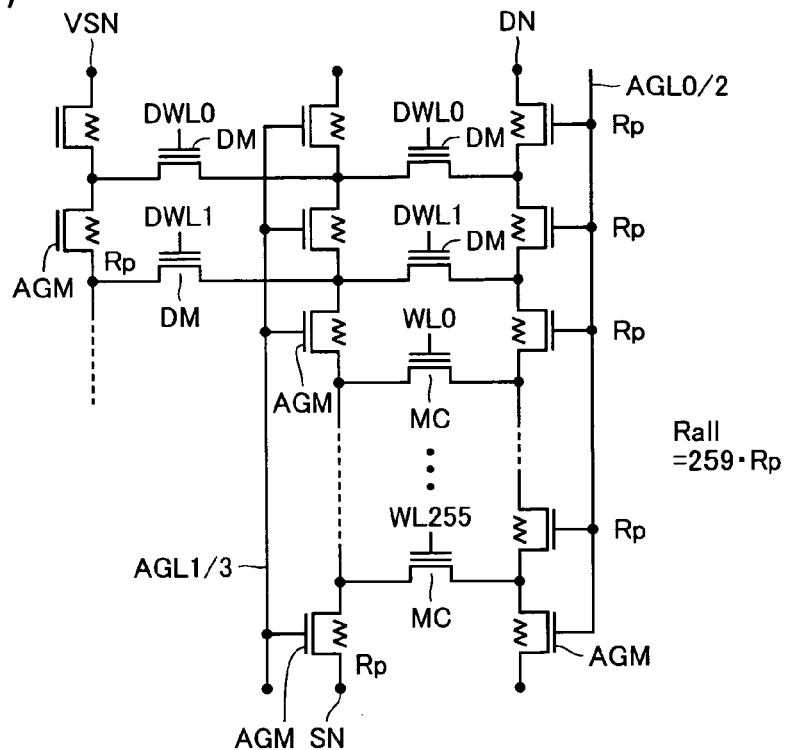
FIG. 7 schematically illustrates resistance distribution in an inversion layer local bit line in the first embodiment of the present invention.

FIG. 7 schematically illustrates resistance distribution over drain-side local bit line LBL and source-side local bit line SLB. In FIG. 7, dummy cells DMs are connected to dummy word lines DWL0 and DWL1, and memory cells MC are connected to each of word lines WL0-WL255. Assist gate line AGL0/2 (AGL0 or AGL2) and assist gate line AGL1/3 (AGL1 or AGL3) are provided on both sides of dummy cell DM and memory cell MC. When in selection state, an inversion layer is formed below assist gate lines AGL0/2 and AGL1/3. In FIG. 7, the inversion layer is shown with a MOS transistor AGM. In the inversion layer, a channel resistance Rp of MOS transistor (assist gate transistor) AGM is distributed. Therefore, in assist gate line AGL0/2, there exist a total of 259 assist gate transistors AGMs from the one connected to a drain-side node DN (a node connected to a global bit line via block selection gate STS) to the one corresponding to memory cell MC connected to word line WL255, and the inversion layer has total resistance Rall of 259·Rp.

Similarly, there exist 259 assist gate transistors AGMs formed below assist gate line AGL1/3, the source line inversion layer has total resistance Rall of 259·Rp.

A local bit line formed below assist gate line AGL1/3 is connected to common line CD via a source-side node SN and the selection gate STD. Dummy cell DM is also provided adjacent to assist gate line AGL1/3 constituting the source-side local bit line. Dummy cell DM is also coupled to a virtual source node VSN via assist gate transistor AGM. The virtual source node VSN is coupled to a corresponding global bit line via the block selection gate.

Figure 8:
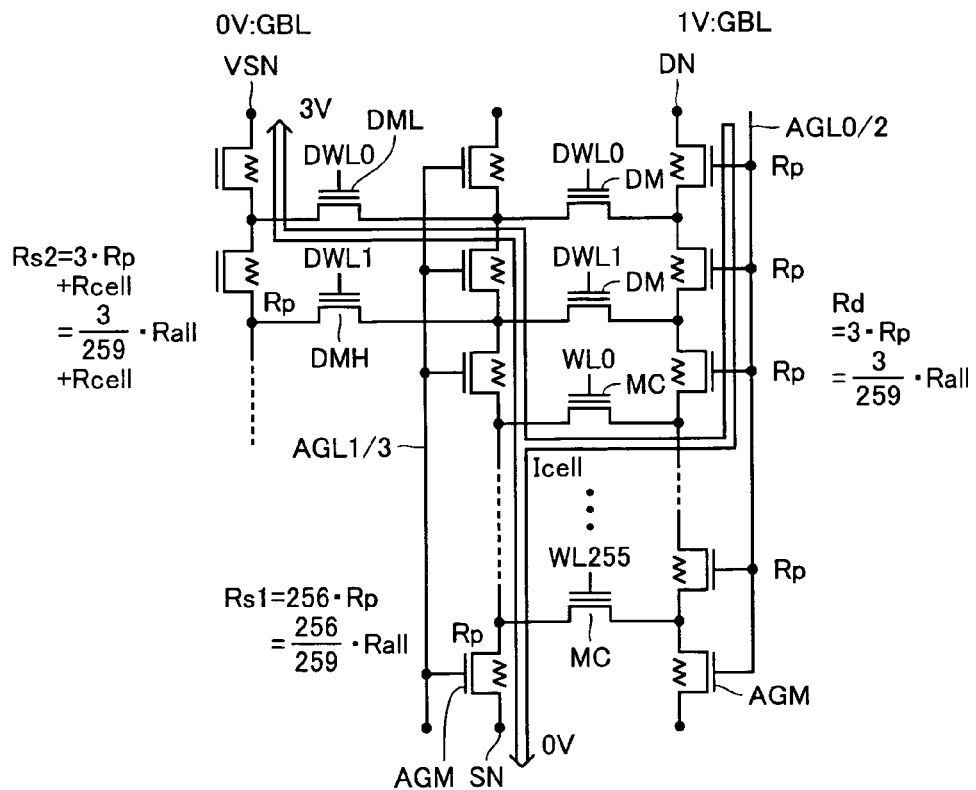
FIG. 8 schematically illustrates a flow of a memory cell current when a word line closest to a global bit line is selected.

FIG. 8 schematically illustrates a path through which the memory cell current flows when word line WL0 is selected. In this case, a voltage of about 3 V is applied to dummy word line DWL0, and dummy cell DML with a low threshold voltage turns conductive and dummy cell DMH with a high threshold voltage is kept nonconductive. Virtual source node VSN is supplied with 0 V from global bit line GBL. Source-side node SN is supplied with the ground voltage of 0 V from common line CD. Drain-side node DN is supplied with a read voltage of 1 V as the precharge voltage, from global bit line GBL.

When word line WL0 is selected while the drain-side local bit line is being precharged at 1 V by the voltage from global bit line GBL, a memory cell current Icell flows through memory cell MC via the drain-side local bit line formed below assist gate line AGL0/2, and flows to source-side node SN via the source-side local bit line formed below assist gate line AGL1/3. Further, memory cell current Icell is also shunted to virtual source node VSN via dummy cell DML with a low threshold voltage.

A resistance value Rd in the drain-side local bit line is 3·Rp because there exist three assist gate transistors AGMs. Since there exist 256 assist gate transistors AGMs from memory cell MC connected to word line WL0 to source-side node SN, first source line resistance Rs1 up to source-side node SN is 256·Rp. Further, a resistance value in a path from memory cell MC connected to selected word line WL0 to virtual source node VSN via dummy cell DML, that is, second source line resistance Rs2, is 3·Rp+Rcell, because there exist three assist gate transistors AGMs and there also exists channel resistance Rcell in dummy cell DML.

Therefore, the source line resistance to memory cell MC connected to word line WL0 is the parallel combined resistance of resistances Rs1 and Rs2, and thus it can be significantly reduced, as compared to source line resistance Rs1 in the case where dummy cell DML is not provided.

Figure 9:
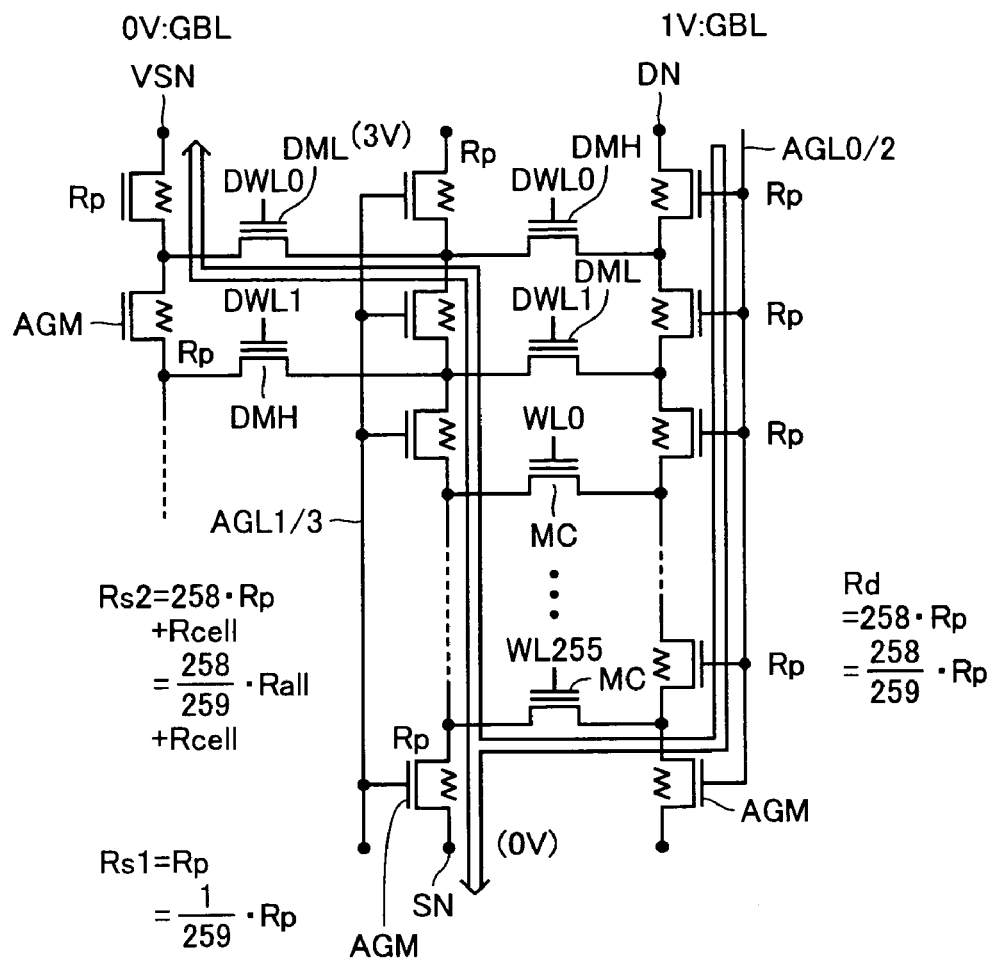
FIG. 9 schematically illustrates a flow of a memory cell current when a word line closest to a source-side node is selected.

FIG. 9 schematically illustrates a path through which memory cell current Icell flows when word line WL255 closest to source-side node SN is selected. Also in the configuration shown in FIG. 9, drain-side node DN is supplied with the voltage of 1 V via global bit line GBL (for example global bit line GBL1), and virtual source node VSN is supplied with the ground voltage (0 V) from corresponding global bit line GBL (for example GBLm1). Source-side node SN is also supplied with the ground voltage (0 V) from common line CD via the block selection gate.

When word line WL 255 is selected, dummy word line DWL0 is selected, and a voltage of about 3 V is applied to the selected dummy word line DWL0. The dummy cell in the same column as the selected memory cell and connected to the selected dummy word line is dummy cell DMH with a high threshold voltage, which in turn is maintained nonconductive and exerts no influence on the memory cell current. Dummy word line DWL1 is not selected, and maintained, for example, at the ground voltage of 0 V. Dummy cells DML and DMH connected to dummy word line DWL1 are nonconductive.

Since 258 assist gate transistors AGMs are connected between drain-side node DN and memory cell MC connected to word line WL255, the drain-side local bit line has resistance Rd of 258·Rp. As for the source-side local bit line, one assist gate transistor AGM is connected between memory cell MC connected to word line WL 255 and source-side node SN, and thus the first source line resistance Rs1 is equal to Rp. On the other hand, since dummy cell DML is selected, resistance value Rs2 (the second source line resistance) in a path from memory cell MC connected to word line WL255 to virtual source node VSN via dummy cell DML is 258·Rp+Rcell in total, because there exist 257 assist gate transistors AGMs in the inversion layer below assist gate line AGL1/3 and there also exists one assist gate transistor between dummy cell DML and virtual source node VSN. Here, Rcell indicates the channel resistance (ON resistance) when dummy cell DML becomes conductive, as in FIG. 8.

When dummy word line DWL0 is selected, the dummy cell provided in the same column as the selected memory cell MC is dummy cell DMH with a high threshold voltage, which in turn is maintained nonconductive, not affecting the memory cell current.

Accordingly, also in this case, the source line resistance to memory cell MC connected to word line WL255 is the parallel combined resistance of resistances Rs1 and Rs2, and thus the source line resistance can be significantly reduced.

When virtual source node VSN is utilized as a drain node and drain node DN is utilized as a virtual source node, dummy word line DWL1 is selected. Also in this case, the source line resistance via a dummy cell has the same resistance distribution in the inversion layer as in the cases shown in FIGS. 8 and 9.

Figure 10:
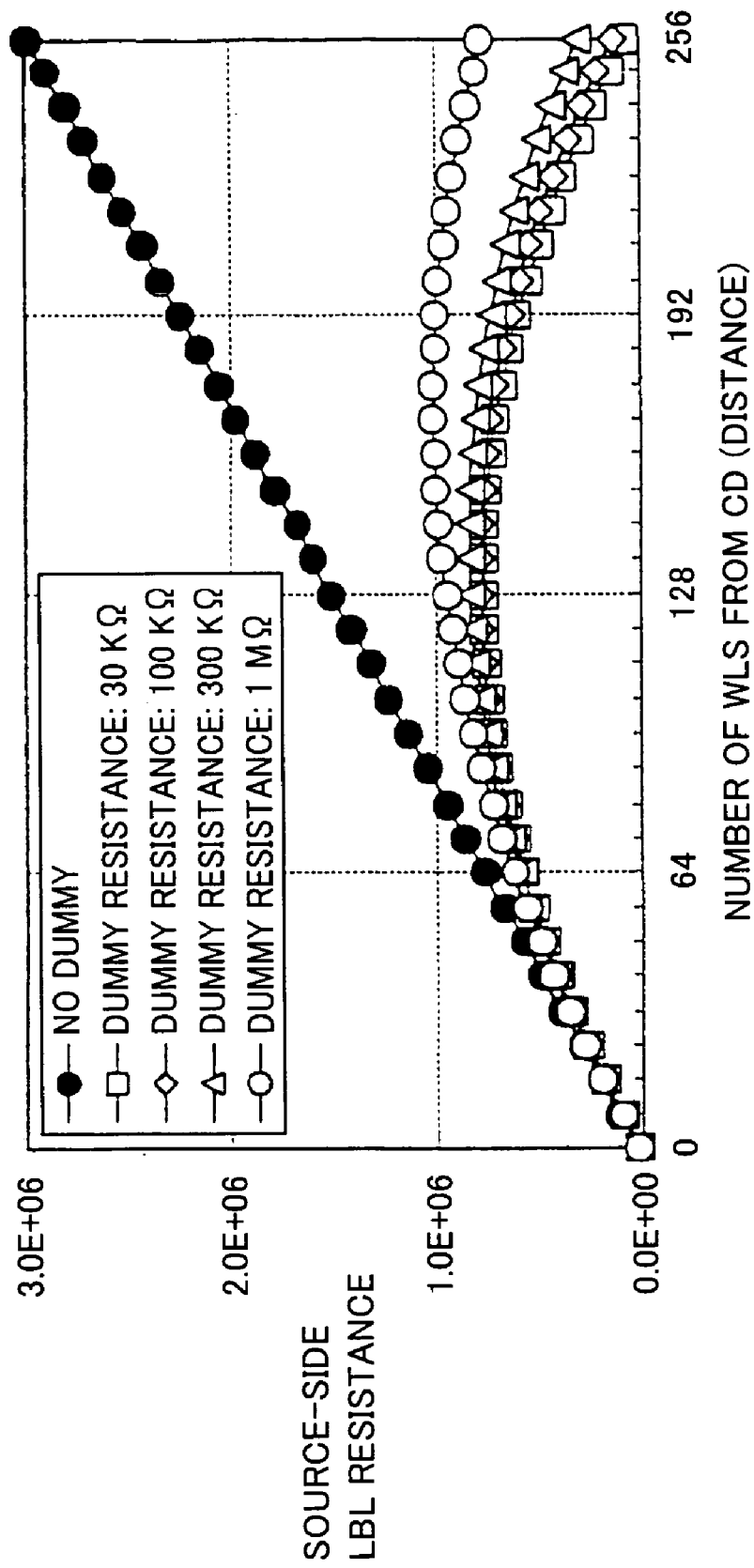
FIG. 10 schematically shows the dependency of source line resistance on a position of the memory cell array in the first embodiment of the present invention.

FIG. 10 schematically illustrates relationship between the resistance in source-side local bit line (SBL) and the number of the word lines (WL) (distance) from common line CD to a selected memory cell in the first embodiment of the present invention. In FIG. 10, the vertical axis represents the resistance in the source-side local bit line (LBL; local bit line here), and the horizontal axis represents the number of the word lines (WL) from common line CD to a selected memory cell. FIG. 10 shows cases where no dummy cell is provided (marked with black circles), channel resistance Rcell of the dummy cell is set at 30 KΩ (marked with squares), resistance Rcell of the dummy cell is set at 100 KΩ (marked with rhombuses), resistance Rcell of the dummy cell is set at 300 KΩ (marked with triangles), and resistance Rcell of the dummy cell is set at 1 MΩ (marked with white circles). Total resistance Rall in the inversion layer is assumed to be 3.0 MΩ.

As can be seen in FIG. 10, the distribution of resistance values in the source-side local bit line is reduced. Specifically, assuming that the resistance value (259·Rp) between a global bit line and the end portion of the inversion layer within a memory block is 3 MΩ, and resistance value Rcell of a single dummy cell is 300 KΩ, it is seen that the resistance value of the source-side local bit line is reduced to about one fourth times in the absolute value, and position dependency of the resistance value in the source-side local bit line is accordingly reduced to about one fourth times.

FIG. 11 shows, in a list form, the read sequence when one memory cell MC stores four-value (quad-level) data. In this case, after a global bit line is precharged to 1 V, a voltage of 3 V is initially applied to a selected word line. Determination is made on whether global bit line GBL is at a potential of 0 V or 1 V after discharging operation. Next, a voltage of 4 V is applied to the selected word line, and determination is made on whether the potential of global bit line GBL is at the precharge voltage level of 1 V or discharged voltage level of 0 V. Then, a word line read voltage of 2 V is applied to the selected word line, and determination is made on whether global bit line GBL after discharging operation has a voltage of 0 V or 1 V.

In the case where global bit line GBL is discharged in any of word line read voltages 1-3 (voltages of 3 V, 4 V, and 2 V, respectively), the threshold voltage Vth of the memory cell is lower than a voltage of 2 V, and data "11" is read. On the other hand, in the case where global bit line GBL is discharged when word line read voltages 1 and 2 are set at 3 V and 4 V, respectively, and global bit line GBL is maintained at the precharge voltage level of 1 V when the word line read voltage is set at 2V (when word line read voltage 3 is supplied), the threshold voltage Vth of the memory cell is between 2 V and 3 V, and data "10" is read.

In the case where global bit line GBL is maintained at the precharge voltage level of 1 V when the word line read voltage is set at 3V, and global bit line GBL is discharged to 0 V when the word line read voltage is set at 4 V, this global bit line GBL is not discharged even when a voltage of 2 V is applied as word line read voltage 3, and thus threshold voltage Vth of the memory cell is set between 3 V and 4 V, and data "00" is read.

In the case where global bit line GBL is not discharged and is maintained at the precharge voltage level of 1 V in any of word line read voltages 1-3, the threshold voltage Vth of the memory cell is not lower than 4 V, and data "01" is read.

Accordingly, four-value data can be read by applying word line read voltages of different levels to a selected word line over a plurality of times. To store such four-value data, it is necessary to minimize the width of threshold voltage distribution. Suppressing variations in the source line potential as in the present invention allows for providing a current flow precisely according to the threshold voltage of a memory cell transistor, and implementing correct data read.

FIG. 12 shows, in a list form, voltages applied to associated signal lines when data stored in memory cells MCa-MCd shown in FIG. 3 is to be read. When data stored in memory cells MCa-MCd is to be read, block selection control signals STS and STD are both set at 5 V. Responsively, block selection gates TGS and TGD are rendered conductive, and a global bit line is connected to corresponding drain-side local bit line LBL, while common line CD is connected to source-side local bit line SLB. Common line CD is maintained at the ground voltage (0 V).

When memory cells MCa and MCb are to be read, the precharge voltage of 1V is supplied to global bit line GBL0, precharging the corresponding drain-side local bit line. Global bit line GBL1 is set at 0 V. Dummy word line DWL0 is set at 3 V, and dummy word line DWL1 is set at −2 V and is in a non-selected state. When memory cell MCa or MCb is selected, assist gate control signals AG0 and AG2 are set at 5 V. When memory cell MCa is selected, assist gate control signals AG1 and AG3 are set at −2 V and 5 V, respectively, and when memory cell MCb is selected, assist gate control signals AG1 and AG3 are set at 5 V and −2 V, respectively. Thus, when data in memory cell MCa is to be read, global bit line GBLm1 is coupled to source-side local bit line SLB0 via dummy cell DML, and when memory cell MCb is selected, global bit line GBL1 is coupled to source-side local bit line SLB1 via a dummy cell. Even when any of memory cells MCa and MCb is selected, data read is performed depending on the absence or presence of a change in the precharge voltage of global bit line GBL0.

When memory cell MCc or MCd is selected, global bit line GBL0 is set at 0 V, global bit line GBL1 is precharged to 1 V, to have the voltage change thereon detected. When memory cell MCc or MCd is selected, dummy word line DWL0 is set at −2 V, and dummy word line DWL1 is set at 3 V. Assist gate control signals AG0 and AG2 are both set at 5 V when memory cell MCc or MCd is selected. When memory cell MCc is selected, assist gate control signals AG1 and AG3 are set at 5 V and −2 V, respectively, and when memory cell MCd is selected, assist gate control signals AG1 and AG3 are set at −2 V and 5 V, respectively. Consequently, when memory cell MCc is selected, global bit line GBL0 is coupled to source-side local bit line SLB1 via dummy cell DML, and global bit line GBL1 has the precharge voltage changed according to data in memory cell MCc. Assist gate control signal AG3 is set at −2 V and source-side local bit line SLB2 has no inversion layer formed, which prevents a current from flowing via adjacent memory cell MCd.

When memory cell MCd is selected, the precharge voltage (1V) is supplied to global bit line GBL1, and global bit line GBL2 supplies a virtual source line voltage, reducing the source line resistance to memory cell MCd. Assist gate control signal AG1 is set at a negative voltage and source-side local bit line SLB1 has no inversion layer formed and is in a high resistance state, to cause no current flow. Consequently, data stored in memory cell MCd can be read correctly, according to the magnitude of the current flowing from global bit line GBL1 to common line CD and to global bit line GBL2.

It is to be noted that assist gate control signal AG0 drives a local bit line disposed corresponding to a global bit line to a selected state (to form an inversion layer), and assist gate control signals AG1 and AG3 control the formation of an inversion layer in source-side sub bit line SLB connected to common line CD (when data is to be read). Consequently, when data in memory cell MCa is read in global bit line GBL0, data in memory cell MCaa shown in FIG. 3 can also be read via global bit line GBL2. In this state, source-side local bit line SLB2 and global bit line GBL1 serve as the source lines for memory cell MCaa. Therefore, multi-bit data such as 4-bit data, 8-bit data, or 16-bit data can be read simultaneously by providing multiple sense amplifier circuits (data read circuits) to the global bit lines. When data is to be read in the global bit lines, data in an even-numbered global bit line or data in an odd-numbered global bit line is read (because the other global bit line should be used to supply the source voltage to the virtual source node).

The configuration supplying the ground voltage to virtual source node VSN via a global bit line can simply be implemented by a configuration supplying the ground voltage to all of non-selected global bit lines in response to Y address signal. For example, when a reset gate resetting a voltage to a ground voltage level in a standby state (cycle) is provided for each global bit line, only the reset gate for a global bit line on a selected column is deactivated to stop the reset to the ground voltage level and the reset gates for the global bit lines on remaining non-selected columns are activated in response to a column selection signal in data reading, to maintain the voltage at the ground voltage level. Even when the global bit lines on the both sides of the global bit line in the selected column are maintained at the ground voltage, the assist gate control signal to a memory cell in the non-selected column is in inactive state (−2 V), and a source-side local bit line is formed for a memory cell in the selected column and connected to the global bit line via a dummy cell, correctly reading data in the memory cell in the selected column.

As described above, according to the first embodiment of the present invention, a dummy cell is disposed at the end of an array block close to a global bit line, and a source-side local bit line for a selected memory cell column is connected to the global bit line via the dummy cell. Thus, without providing an additional circuit or interconnection line, source line resistance of a selected memory cell can be reduced, dependency of a threshold voltage or a source voltage of the memory cell on the position within the memory cell array (within the block) can be reduced, and influence of temperature dependency can also be suppressed. Therefore, there is no need to use a circuit having a steep compensating characteristics gradient to provide compensation over a wide range, in order to compensate for position/temperature dependency of the source voltage of the memory cell, and the configuration of such a compensation circuit can be simplified (because its adjustment range can be narrowed).

Second Embodiment

Figure 13:
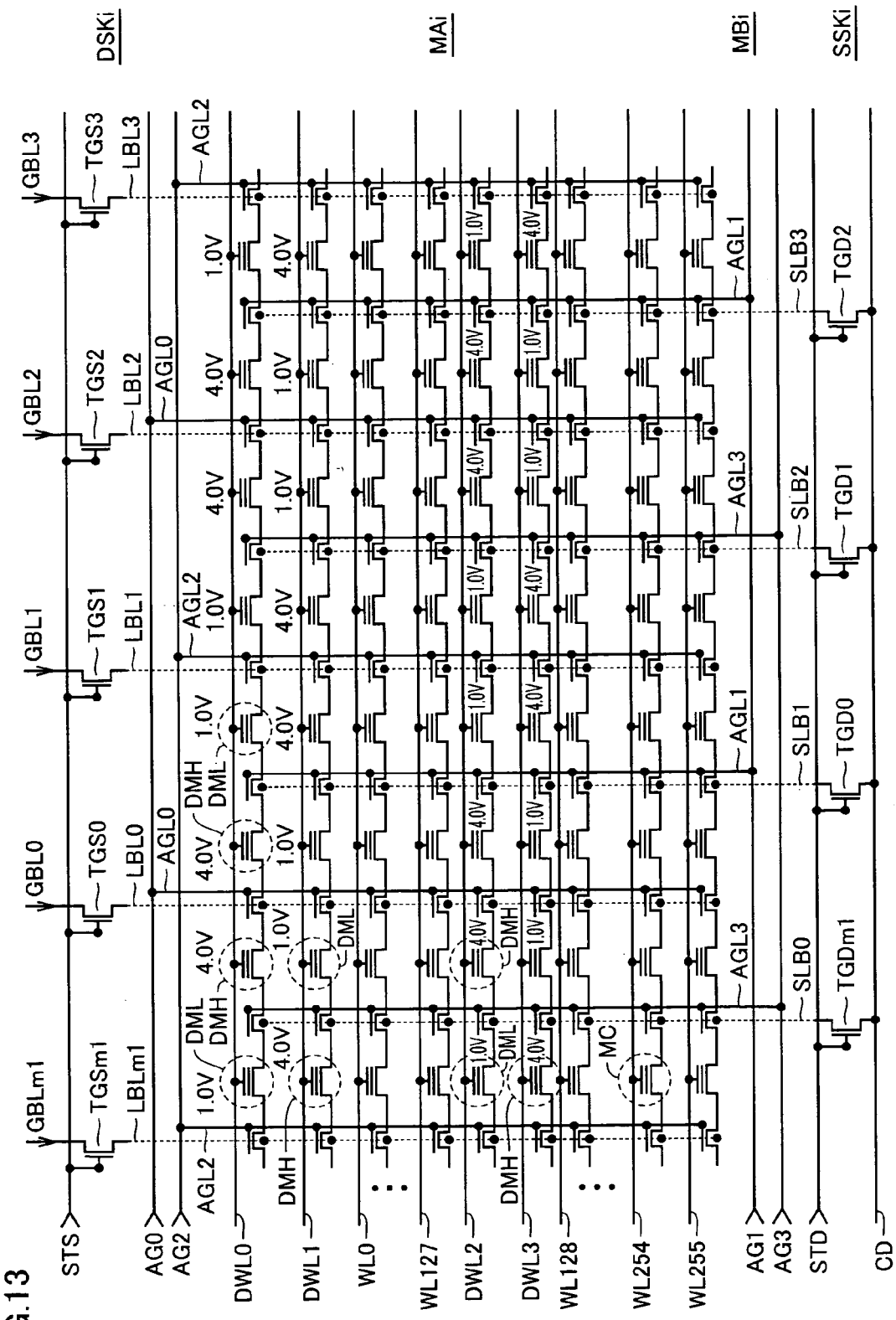
FIG. 13 shows a configuration of a memory cell array in accordance with a second embodiment of the present invention.

FIG. 13 shows a configuration of a memory array MAi in a memory block in accordance with a second embodiment of the present invention. In memory array MAi shown in FIG. 13, dummy word lines DWL2 and DWL3 are further provided between word lines WL127 and WL128. On dummy word line DWL2, dummy cells DMLs having a threshold voltage of 1.0 V and dummy cells DMHs having a threshold voltage of 4.0 V are alternately disposed in units of two bits, in the same memory cell arrangement as that of dummy word line DWL0.

Also on dummy word line DWL3, dummy cells DMLs and DMHs are alternately disposed in units of two bits, in the same memory cell arrangement as that of dummy word line DWL1. Since other components of memory array MAi shown in FIG. 13 are the same as those of memory array MAi shown in FIG. 3, corresponding parts or components will be designated by the same reference numerals or characters and the detailed description thereof will not be repeated.

In the memory array configuration shown in FIG. 13, dummy word lines DWL0 and DWL2 are selected simultaneously, and dummy word lines DWL1 and DWL3 are selected simultaneously. Accordingly, source-side local bit line SLB for a selected memory cell is connected at its end point to adjacent non-selected global bit line GBL via dummy cell DML, and in addition, is coupled at its central portion to the adjacent non-selected global bit line via the dummy cell DML. The source-side local bit line has the other end (starting end) connected to common line CD via block selection gate TGD.

Figure 14:
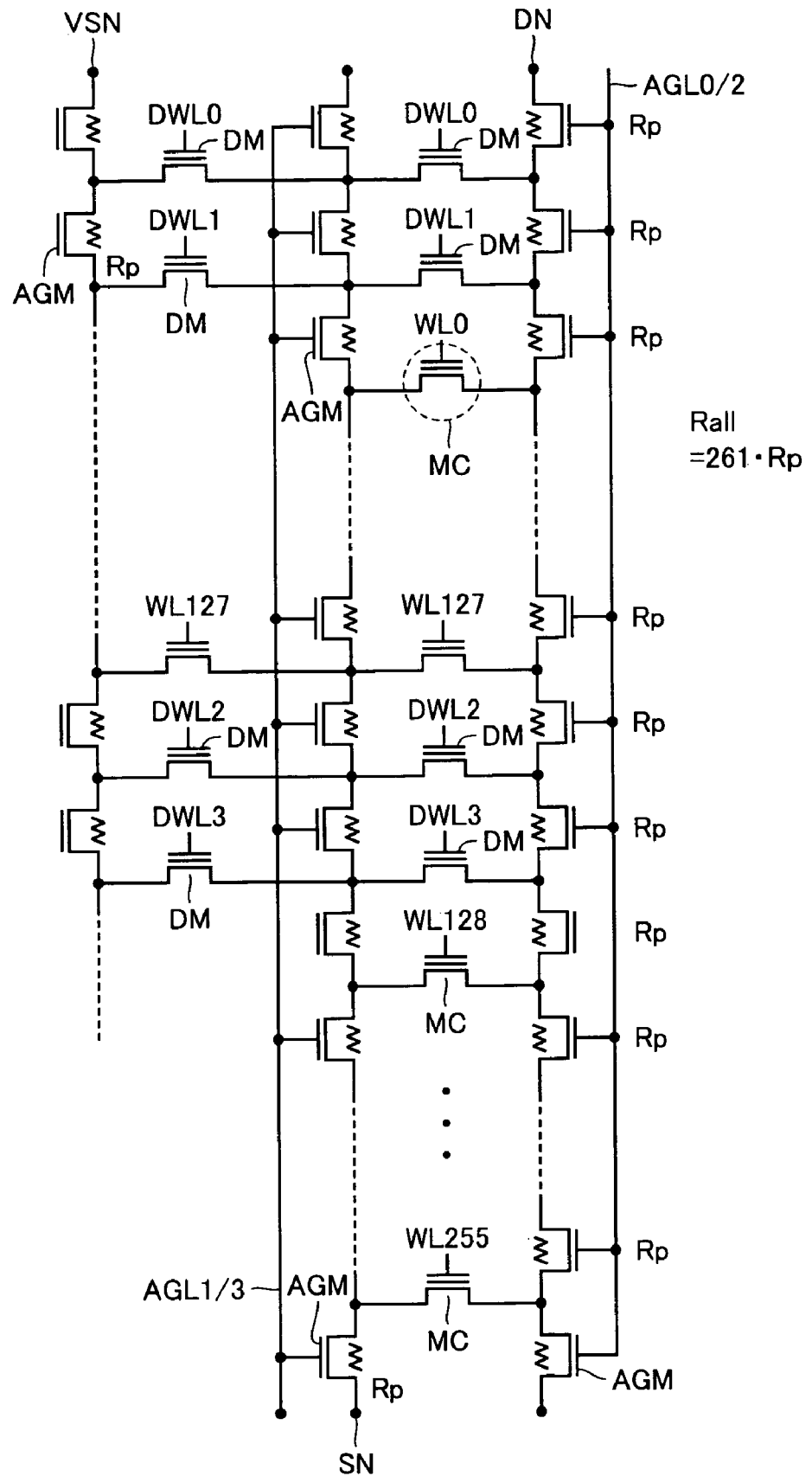
FIG. 14 schematically illustrates resistance distribution in an inversion layer local bit line in the second embodiment of the present invention.

FIG. 14 schematically illustrates resistance distribution in an inversion layer local bit line in memory array MAi shown in FIG. 13. Since dummy word lines DWL2 and DWL3 are further provided between word lines WL127 and WL128 as shown in FIG. 14, the number of assist gate transistors AGMs is increased by two, as compared to the resistance distribution shown in FIG. 7. Accordingly, resistance of 261·Rp is distributed over the inversion layer formed below assist gate line AGL0/2. Also, 261 assist gate transistors AGMs are provided over the inversion layer (source-side local bit line) formed below assist gate line AGL1/3, and resistance of 261·Rp is also distributed.

Since other components of the resistance distribution shown in FIG. 14 is the same as those of the resistance distribution shown in FIG. 7, corresponding parts will be designated by the same reference numerals or characters and the detailed description thereof will not be repeated.

Figure 15:
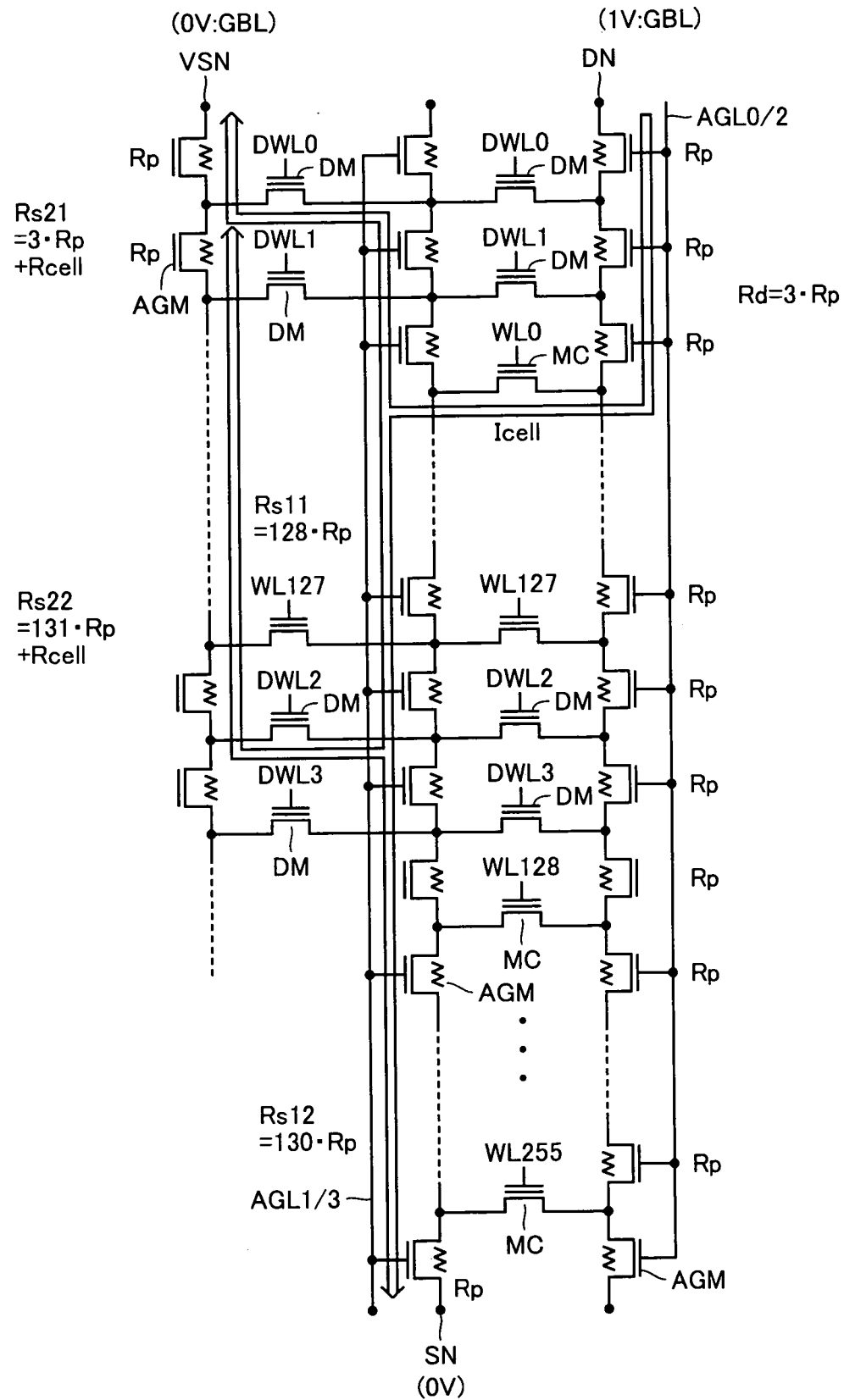
FIG. 15 schematically illustrates a path through which a memory cell current flows when a word line closest to a drain-side node is selected.

FIG. 15 schematically illustrates a path through which a memory cell current flows when word line WL0 is selected in the arrangement shown in FIG. 14. Global bit line GBL connected to the drain-side local bit line is supplied with 1.0 V, and the global bit line connected to virtual source node VSN is supplied with the ground voltage of 0 V.

In FIG. 15, drain resistance Rd for memory cell MC connected to word line WL0 is 3·Rp because there exist three assist gate transistors AGMs. The current flowing via memory cell MC is shunted via the source-side local bit line. Assuming that dummy word lines DWL0 and DWL2 are selected, resistance Rs21 for the current flowing via dummy cell DM (DML) connected to dummy word line DWL0 is 3·Rp+Rcell, because there exist three assist gate transistors AGMs. Here, Rcell indicates a channel resistance of dummy cell DML.

The current flowing via the source-side local bit line is further shunted via dummy cell DM (DML) connected to dummy word line DWL2. Resistance Rs11 in the inversion layer source-side local bit line down to dummy cell DM connected to dummy word line DWL2 is 128·Rp, because there exist 128 assist gate transistors AGMs. Resistance Rs22 for the current flowing through the inversion layer local bit line via dummy cell DM (DML) connected to dummy word line DWL2 is 131·Rp+Rcell, because there exist 131 assist gate transistors AGMs up to virtual source node VSN. Further, source line resistance Rs12 for the current flowing down to source node SN via the inversion layer source-side local bit line is 130·Rp, because there exist 130 assist gate transistors AGMs down to source node SN.

The parallel combined resistance of the source-side local bit line and the virtual source-side local bit line contributes as source line resistance for memory cell MC connected to word line WL0. As compared to source line resistance Rs of 256·Rp in the case when no dummy cell exists, the source line resistance can be reduced significantly.

Figure 16:
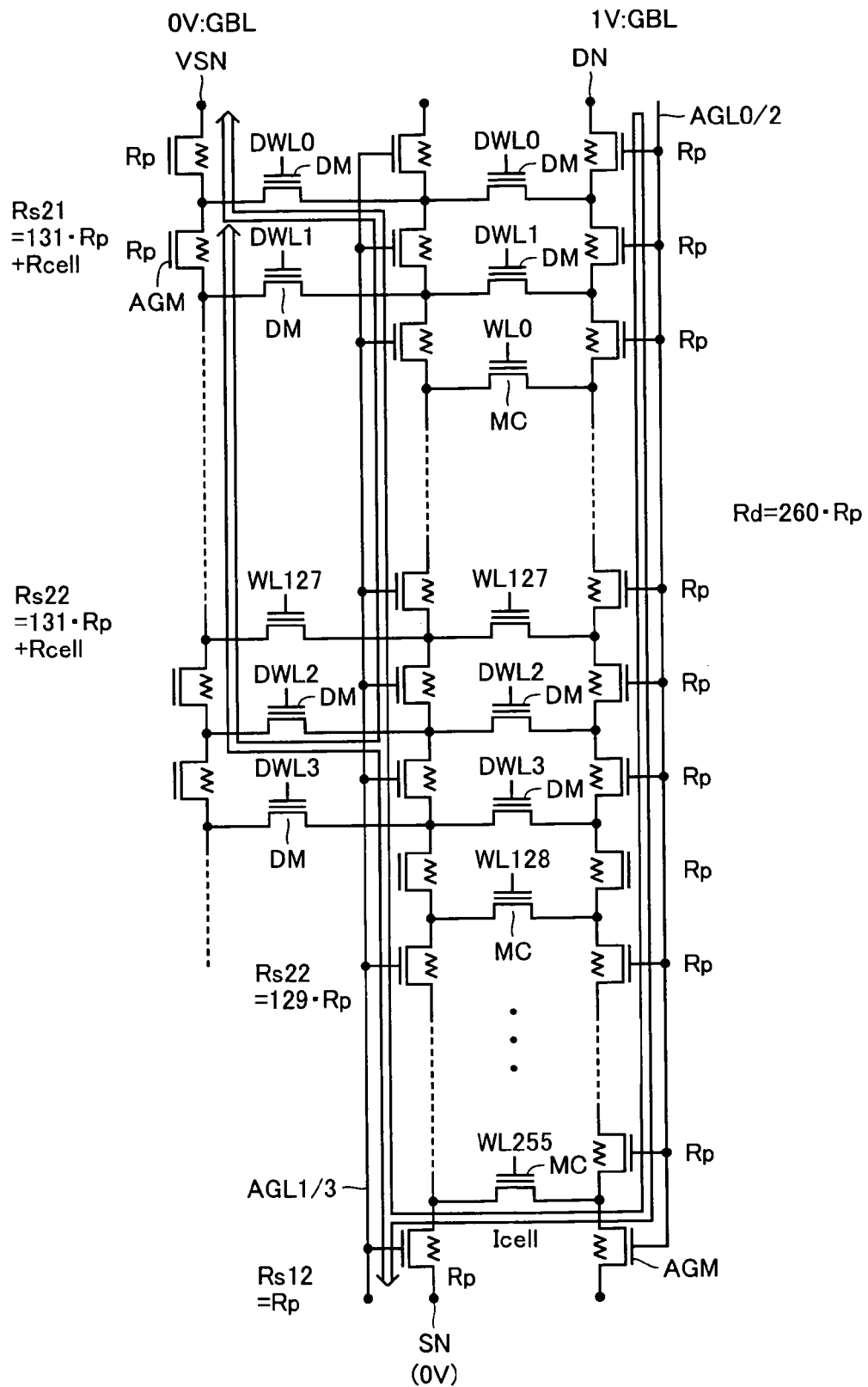
FIG. 16 schematically illustrates a path through which a memory cell current flows when a memory cell closest to a source-side node is selected.

FIG. 16 schematically illustrates a path through which a memory cell current flows when word line WL255 closest to source node SN is selected. FIG. 16 also shows the path of the current when dummy word lines DWL0 and DWL2 are selected. Resistance Rd in the inversion layer local bit line connected to drain-side node DN down to word line WL255 is 260·Rp.

In a path through which cell current Icell flows to source node SN via memory cell MC connected to word line WL255, source line resistance Rs12 is equal to Rp. Resistance Rs22 in a path from word line WL255 to dummy word line DWL2 is 129·Rp because there exist 129 assist gate transistors AGMs. The resistance for the current flowing via dummy cell DM (DML) connected to dummy word line DWL2 with respect to the vertical source-side local bit line, can be represented as 131·Rp+Rcell, since there exist 130 assist gate transistors AGMs in the current path from dummy word line DWL2 to dummy word line DWL0.

In contrast, resistance Rs21 for the current flowing via dummy cell DM (DML) connected to dummy word line DWL0 is 131·Rp+Rcell, since there exist 130 assist gate transistors AGMs from dummy cell DM connected to dummy word line DWL2 to dummy cell DM connected to dummy word line DWL0.

Therefore, also in this case, the combined resistance in a network of resistances in the shunted current paths can contribute as source line resistance for memory cell MC connected to word line WL255, and suppress an increase in the source line resistance.

Figure 17:
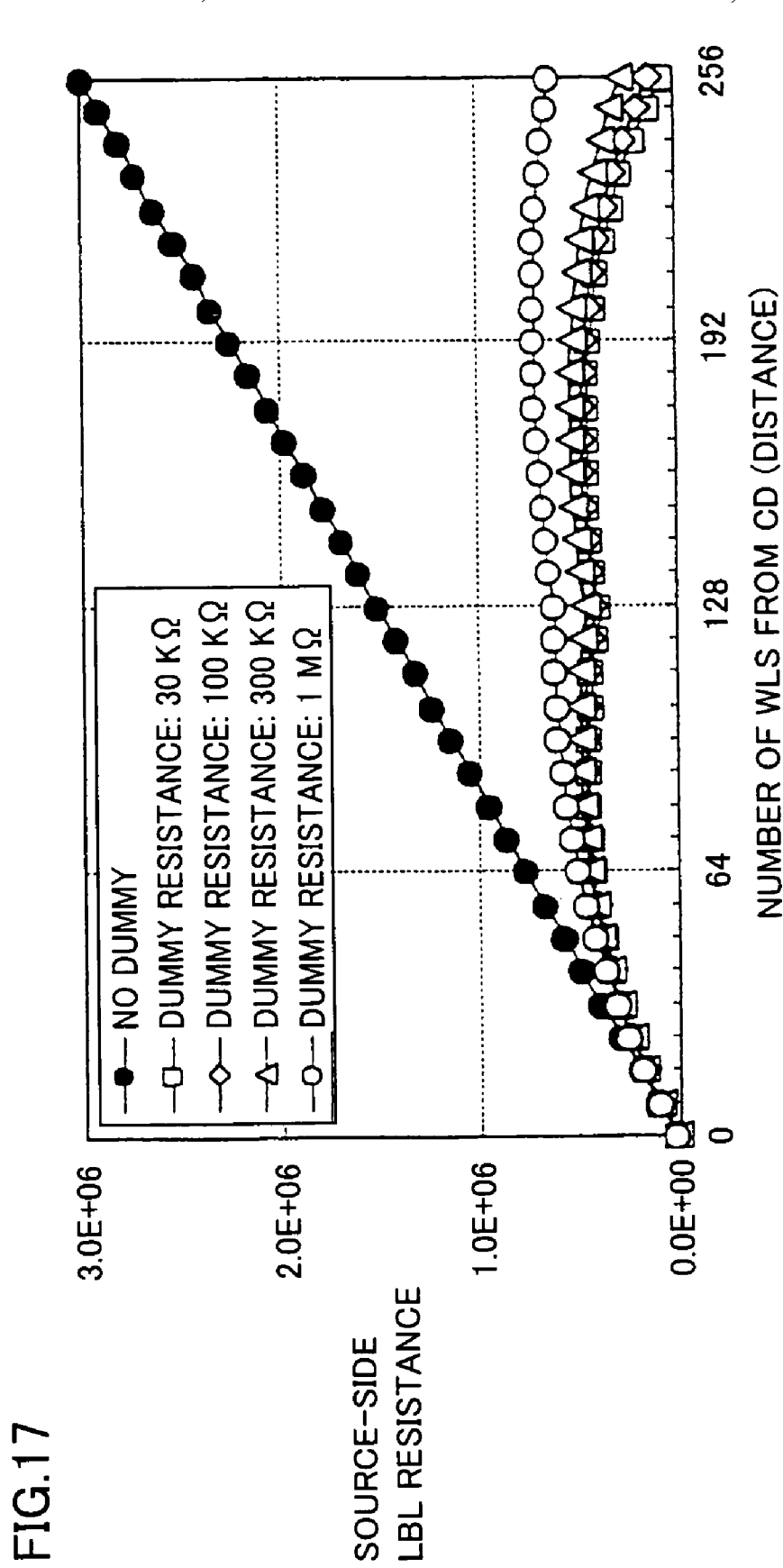
FIG. 17 schematically illustrates dependency of source line resistance on a position in a memory cell array in the second embodiment of the present invention.

FIG. 17 schematically illustrates dependency of a resistance value in an inversion layer source-side local bit line (LBL; local bit line here) on the number of the word lines (WL) (distance) from the common line (CD) to a selected memory cell in the second embodiment of the present invention. In FIG. 17, the vertical axis represents the resistance value in the source-side local bit line (LBL), and the horizontal axis represents the number of the word lines (WL) from common line CD to a selected memory cell. The resistance value in the entire inversion layer of the local bit line is assumed to be 3 MΩ. The source line resistance when no dummy cell is provided is marked with black circles, the source line resistance when the dummy cell has a resistance value of 30 KΩ is marked with white squares, the source line resistance when the dummy cell has a resistance value of 100 KΩ is marked with white rhombuses, the source line resistance when the dummy cell has a resistance value of 300 KΩ is marked with white triangles, and the source line resistance when the dummy cell has a resistance value of 1 MΩ is marked with white circles.

Since dummy cells are further provided in a central portion of the memory array in comparison to the first embodiment, to form a source line parallel resistance network, resistance distribution in source-side local bit line (LBL) symmetrical with respect to the central portion of the memory array (the portion having 128 word lines) can be provided as shown in FIG. 17. Therefore, variations in the source line resistance can further be reduced, as compared to the first embodiment.

It is to be noted that the manner in which voltages are applied to assist gate control signals AG0-AG3 and dummy word lines DWL0-DWL3 depending on a position of a selected memory cell is the same as that shown in FIG. 12, except that dummy word lines DWL0 and DWL2 are selected simultaneously and dummy word lines DWL1 and DWL3 are selected simultaneously.

As described above, according to the second embodiment of the present invention, a dummy cell is disposed at an end of a memory array close to a global bit line (drain-side node), and an additional dummy cell for shunting a source line is disposed in a central portion of the memory array. With this configuration, dependency of source line resistance to a selected memory cell has a reduced dependency on the position within the memory cell array can be reduced, and also reduced temperature dependency.

Third Embodiment

Figure 18:
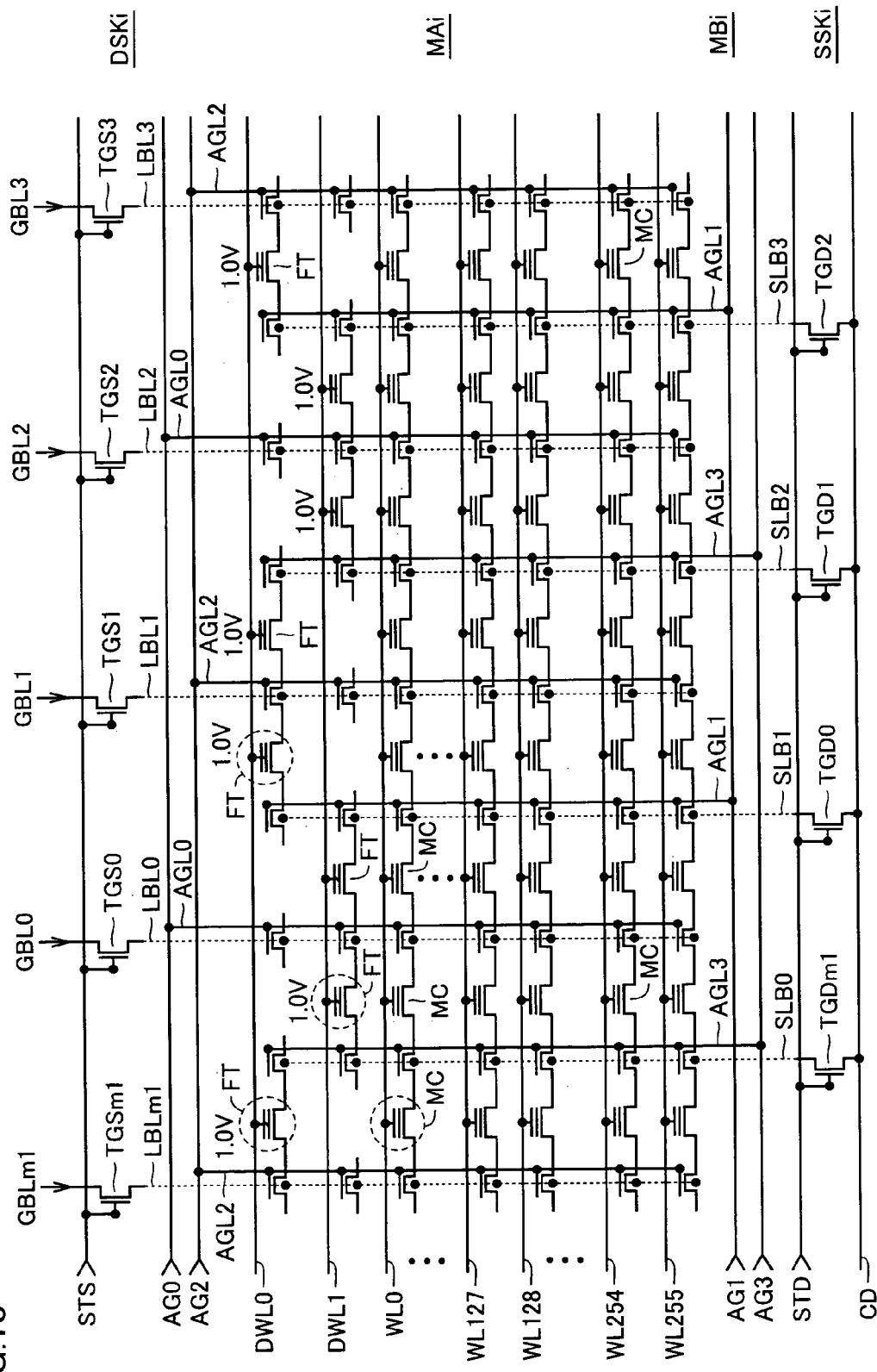
FIG. 18 shows a configuration of a memory array in accordance with a third embodiment of the present invention.

FIG. 18 shows a configuration of memory array MAi in accordance with a third embodiment of the present invention. In the configuration shown in FIG. 18, a floating gate transistor FT in which a floating gate and a control gate are shorted is used as a dummy cell (DML) having a low threshold voltage. A dummy memory cell having a high threshold voltage is not provided, and floating gate transistors FTs are alternately disposed in units of two columns in dummy word lines DWL0 and DWL1. Since other components of memory array MAi shown in FIG. 18 are the same as those of memory array MAi shown in FIG. 3 in accordance with the first embodiment, corresponding parts will be designated by the same reference numerals and characters and the detailed description thereof will not be repeated.

Since floating gate transistor FT is used as a dummy cell having a threshold voltage of, for example, 1.0 V, there is no need to write data in the dummy cell, simplifying the manufacturing steps. Specifically, floating gate transistor FT, in which a floating gate and a control gate are shorted, has the same function as that of a MOS transistor (an insulating gate type field effect transistor). Consequently, floating gate transistor FT can be selectively made conductive or nonconductive by adjusting a voltage level applied to dummy word lines DWL0 and DWL1. Further, since there is no need to provide a dummy cell having a high threshold voltage, parasitic resistance and parasitic capacitance of the dummy cell having a high threshold voltage can be eliminated, and dummy word line can be charged and discharged at a high speed. Further, in a dummy word line drive circuit, driving load is reduced and thus power consumption can be reduced.

Figure 19:
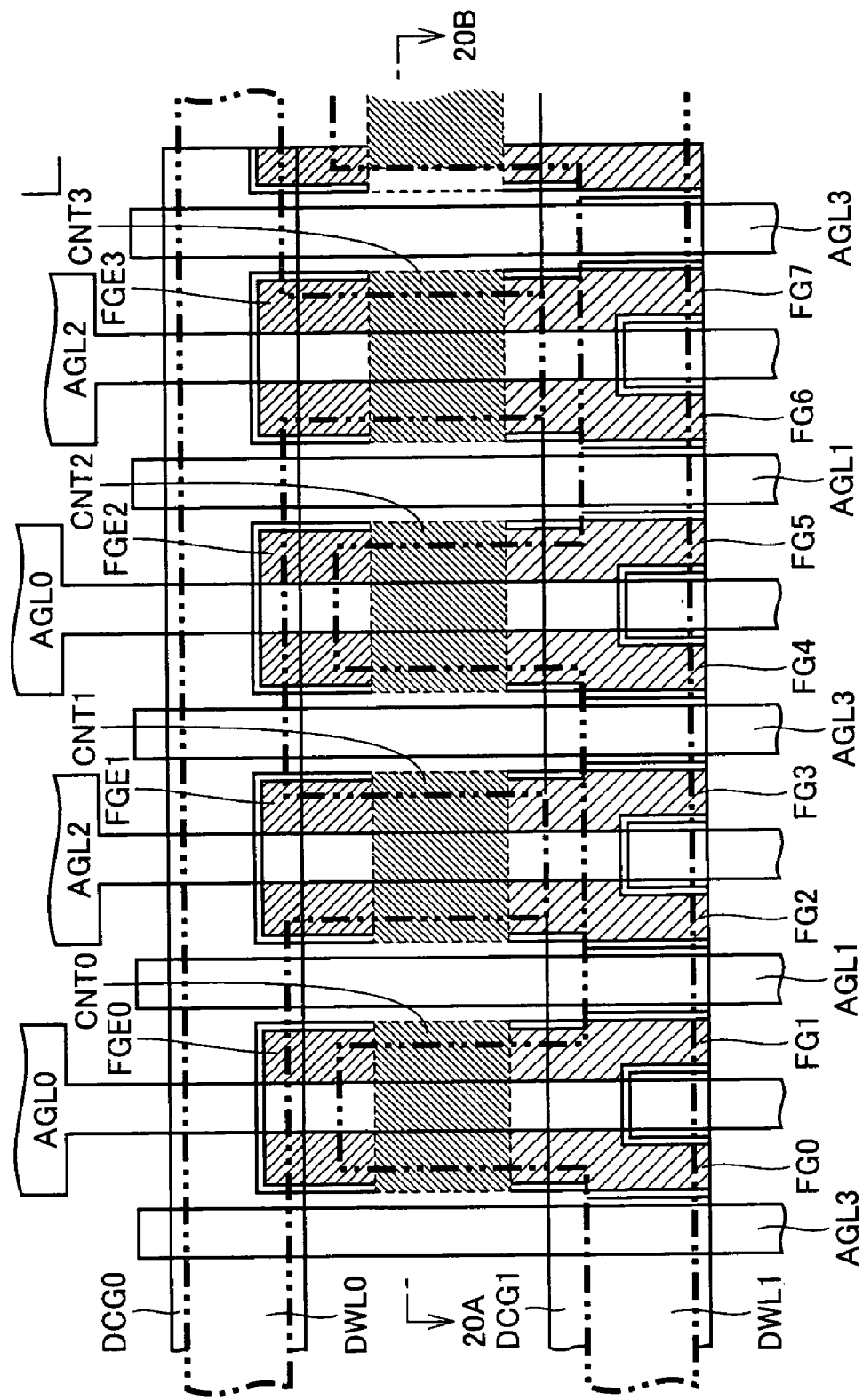
FIG. 19 shows a planar layout of a dummy word line shown in FIG. 18.

FIG. 19 schematically shows a planar layout of dummy word lines DWL0 and DWL1. In FIG. 19, at an end side of a memory array, dummy control gate lines DCG0 and DCG1 are provided as geometry dummy word lines in parallel with word line WL, to maintain layout pattern regularity.

In a direction crossing dummy control gate lines DCG0 and DCG1, assist gate lines AGL0-AGL3 are sequentially and cyclically provided. Contact regions for applying assist gate control signals AG0 and AG2 to assist gate lines AGL0 and AGL2 are formed at the end side portion of the memory array. For assist gate lines AGL1 and AGL3, contacts receiving corresponding assist gate control signals AG1 and AG3 are formed at the other, opposite end side portion (not shown) of the memory array.

At the end side portion of the memory array, floating gate terminating portions FGE0-FGE3 each forming floating gate are formed, with assist gate lines AGL1 and AGL3 disposed in between. Floating gate terminating portions FGE0-FGE3 are each integrally formed, and assist gate line AGL0 or AGL2 is provided below. Floating gate terminating portions FGE0-FGE3 are divided to floating gates FG0-FG7 in a region below dummy control gate DCG1, to maintain patterning regularity of the floating gates with respect to the memory cells. The floating gates are divided correspondingly in each memory cell (dummy cell).

In a region between dummy control gate lines DCG0 and DCG1, contacts CNT0-CNT3 are provided on floating gate terminating portions FGE0-FGE3, respectively. Contacts CNT0-CNT3 are alternately electrically connected to dummy word lines DWL1 and DWL0 made of, for example, a first level metal (metal for the first metal interconnection layer) above dummy control gate lines DCG1 and DCG0. Specifically, dummy word lines DWL1 and DWL0 are formed in a comb-like shape to be interdigital with each other, and have the teeth (projecting portions) of dummy word lines DWL0 and DWL1 disposed alternately, and thus two-bit floating gate transistors can be connected alternately to dummy word lines DWL0 and DWL1.

Figure 20:
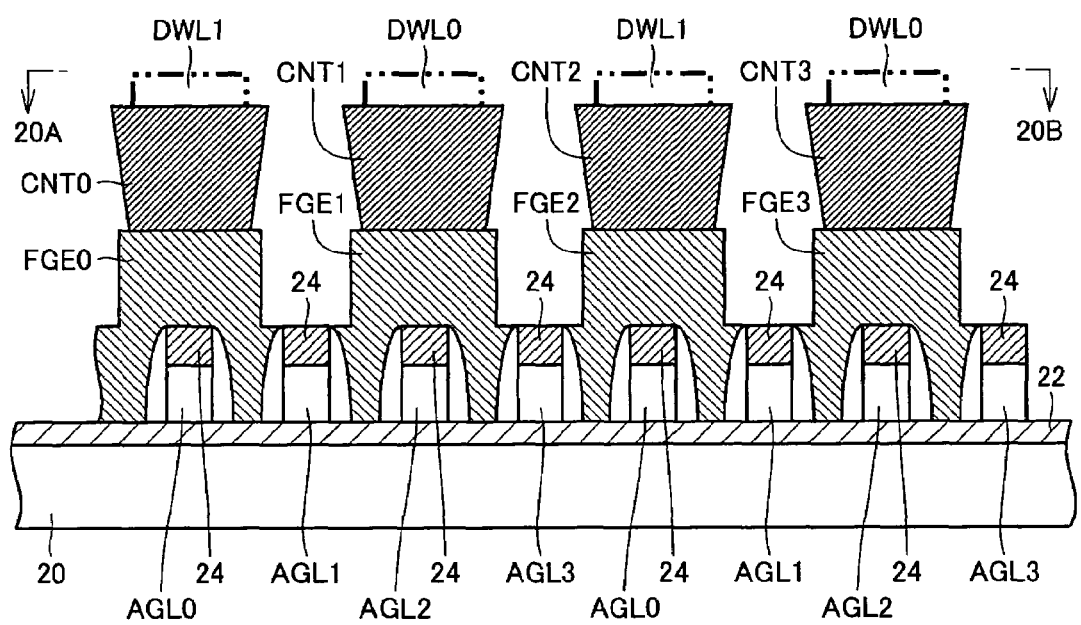
FIG. 20 schematically shows a cross sectional structure along line 20A-20B shown in FIG. 19.

FIG. 20 schematically shows a cross sectional structure taken along line 20A-20B shown in FIG. 19. In FIG. 20, the floating gates and the assist gate lines are alternately disposed on the surface of semiconductor substrate region 20 (corresponding to SUB) via insulating film 22. Floating gate terminating portions FGE0-FGE3 each have the lower portion formed into an arch-shape in cross section, and assist gate lines AGL1-AGL3 are disposed below the arch-shaped portions in the sequential order. On the surface of assist gate lines AGL1-AGL3, interlayer insulating film 24 made of, for example, silicon nitride film is formed.

Each of floating gate terminating portions FGE0-FGE3 has an upper portion formed into a rectangular shape in cross section, and contacts CNT0-CNT3 are provided on floating gate terminating portions FGE0-FGE3. Dummy word lines DWL1 and DWL0 made of, for example, the first level metal are alternately connected to contacts CNT0-CNT3.

Therefore, each of dummy word lines DWL0 and DWL1 is connected to the floating gates of stacked gate type transistors. The floating gate transistors connected to dummy word lines DWL1 and DWL0 are isolated by assist gate lines AGL0 and AGL2, at portions where dummy word lines DWL1 and DWL0 are exposed, and a two-bit dummy cells are disposed at each tooth of dummy word lines DWL0 and DWL1. Specifically, the same configuration as that in the first and the second embodiments in which two dummy cells with a high threshold voltage and two dummy cell with a low threshold voltage are alternately arranged can be implemented.

In the present invention, a global bit line is utilized as a virtual source line during data read. On this occasion, the ground voltage is supplied to the global bit lines on the both sides of the selected global bit line. Since no inversion layer is formed in the source-side local bit line for a dummy cell in a non-selected column, read error can reliably be prevented, and the global bit line can be utilized as a virtual source line with a simple circuit configuration.

As described above, according to the third embodiment of the present invention, a floating gate transistor is used as a dummy cell for reducing the resistance in a source-side local bit line, eliminating a step of writing fixed data to a dummy cell and simplifying the manufacturing steps.

The configuration of using a dummy cell in a nonvolatile semiconductor memory device according to the present invention is applicable to any nonvolatile semiconductor memory device in which source line resistance is not negligible. Even when a source line and a bit line are provided separately, by connecting a dummy cell between an adjacent bit line and the source line, the adjacent bit line can be used as a virtual source line to reduce the source resistance.

The present invention is also applicable to the construction where a bit line is utilized as a source line, even in the case where a diffusion bit line is used. Further, the present invention is further applicable to a nonvolatile memory in which data is stored by accumulating electrical charges in an insulating film.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device, comprising:
- a memory array having a plurality of nonvolatile memory cells, arranged in rows and columns, each storing information in a nonvolatile manner;
- at least one row of a plurality of dummy cells, arranged at an end side of said memory array in a row direction in alignment with the memory cells, each for storing fixed data;
- a plurality of bit lines disposed corresponding to the respective columns of the memory cells so as to be provided on both sides of each column of the memory cells;
- a plurality of word lines disposed corresponding to the rows of the memory cells;
- at least one dummy word line disposed corresponding to said at least one row of the dummy cells;
- row selection circuitry for selecting a word line from said plurality of word lines corresponding to an addressed row in response to an address signal and selecting a dummy word in said at least one dummy word line in data reading, selected memory and dummy cells on a same column sharing a first bit line; and
- column selection/voltage supply circuitry for supplying a read voltage to a second bit line to which a memory cell on a column addressed according to an address signal is connected, and supplying voltages the same in voltage level to the first bit line and to a third bit line to which the dummy cell is connected in the data reading, the first bit line being supplied with the voltage from a side opposite to a side supplying the voltage to the third bit line with respect to the memory array.

2. The nonvolatile semiconductor memory device according to claim 1, wherein the bit line is configured of an inversion layer formed by an assist gate provided on a surface of a substrate.

3. The nonvolatile semiconductor memory device according to claim 1, wherein a dummy cell having a high threshold voltage in an absolute value is disposed in a common column as a memory cell selected by said column selection circuitry, and the dummy cell sharing said first bit line with the selected memory cell has a low threshold voltage in an absolute value.

4. The nonvolatile semiconductor memory device according to claim 1, further comprising,
- a common line extending in the row direction at one end side of said memory array to transfer a predetermined voltage and electrically coupled with said first bit line during the data read, wherein
- said at least one dummy word line comprise a dummy word line disposed at an end side of said memory array opposite to said common line.

5. The nonvolatile semiconductor memory device according to claim 4, wherein said at least one dummy word line further comprises another dummy word line extending in said row direction in a central portion of said memory array.

6. The nonvolatile semiconductor memory device according to claim 1, wherein
- the memory cells each comprise a stacked transistor having a floating gate for accumulating electrical charge, and
- said dummy cells each comprise a floating gate transistor the same in configuration as the memory cells and having a control gate and a floating gate connected together.

7. The nonvolatile semiconductor memory device according to claim 6, wherein
- said at least one dummy word line includes a first dummy word line and a second dummy word line, and
- the dummy cells are alternately connected to the first and second dummy word lines in units of two dummy cells.

8. The nonvolatile semiconductor memory device according to claim 1, further comprising a plurality of global bit lines,
- wherein said column selection/voltage supply circuitry includes a circuit means for coupling the second and third bit lines on a selected column to different global bit lines, respectively.

9. The nonvolatile semiconductor memory device according to claim 1, wherein the one row of dummy cells comprised first dummy cells of a high threshold voltage in absolute value and second dummy cells of a low threshold voltage in absolute value, and a unit of two first dummy cells and a unit of two second dummy cells being alternately arranged on the row.

10. The nonvolatile semiconductor memory device according to claim 9, wherein
- the dummy cell of the high threshold voltage in absolute value and the dummy cell of the low threshold voltage are arranged in alignment on a common column.

* * * * *